United States Patent [19]

Pustilnik et al.

[11] Patent Number: 5,288,332
[45] Date of Patent: Feb. 22, 1994

[54] A PROCESS FOR REMOVING CORROSIVE BY-PRODUCTS FROM A CIRCUIT ASSEMBLY

[75] Inventors: Cecil S. Pustilnik; George E. Shannon, both of Albuquerque, N. Mex.

[73] Assignee: Honeywell Inc., Minneapolis, Minn.

[21] Appl. No.: 13,876

[22] Filed: Feb. 5, 1993

[51] Int. Cl.$^5$ .................. B08B 3/08; C23G 1/02
[52] U.S. Cl. ........................... 134/27; 134/2; 134/3; 134/26; 134/28; 134/29; 134/41
[58] Field of Search ............. 134/28, 29, 27, 34, 134/36, 2, 3, 41

[56] References Cited

U.S. PATENT DOCUMENTS

| | | | |
|---|---|---|---|
| 3,799,803 | 3/1974 | Breazeale et al. | 437/3 |
| 4,610,728 | 9/1986 | Natesh et al. | 134/29 X |
| 4,640,719 | 2/1987 | Hayes et al. | 134/40 |
| 4,740,247 | 4/1988 | Hayes et al. | 134/42 |
| 4,778,532 | 10/1988 | McConell et al. | 134/28 X |
| 4,934,391 | 6/1990 | Futch et al. | 134/40 |
| 4,983,224 | 1/1991 | Mombrun et al. | 134/40 |
| 5,049,200 | 9/1991 | Brunner et al. | 134/28 X |
| 5,129,955 | 7/1992 | Tanaka et al. | 134/28 X |
| 5,181,985 | 1/1993 | Lampert et al. | 134/28 X |

FOREIGN PATENT DOCUMENTS 62-71436 5/1988 Japan .

OTHER PUBLICATIONS

IBM Technical Disclosure Bulletin, vol. 17, No. 8 (Jan. 1975), Semiconductor Cleaning Process.
IBM Technical Disclosure Bulletin, vol. 19, No. 10 (Mar. 1977), Rinsing Semiconductor Bodies Without Depositing Heavy Metal Cations on Their Surface.

*Primary Examiner*—Mark L. Bell
*Assistant Examiner*—Saeed T. Chaudhry
*Attorney, Agent, or Firm*—Ronald E. Champion

[57] ABSTRACT

The invention is a process for removing corrosive by-products from semiconductor assembly by applying an aqueous spray comprising a saponifying agent to release and dissolve flux constituents and applying an acidic aqueous spray to the assembly to dissolve metal contaminants. While the acid source in the aqueous spray may be any number of constituents, preferably carbon dioxide is used. Metal released by the aqueous acid spray is inactivated and bound by a chelating agent which is introduced into the wash. The invention is applicable to any semiconductor device or assembly made through processes using bonding materials such as solder which may have by-products which are corrosive or otherwise deleterious to the device or device assembly once placed in the chosen environment of use.

18 Claims, No Drawings

A PROCESS FOR REMOVING CORROSIVE BY-PRODUCTS FROM A CIRCUIT ASSEMBLY

FIELD OF THE INVENTION

This invention relates generally to cleaning electronic devices and device substrates. More specifically, the invention relates to an environmentally safe manner of removing corrosive by-products from electronic device assemblies and substrates such as for example, circuit boards, circuit card assemblies, printed wafer or wiring boards, and the like.

BACKGROUND OF THE INVENTION

The use of mounting substrates in the field of electronics has been known since the development of the transistor. With the development of more complex devices having more functional capability, these substrates have become more important. For example, the substrates now serve as a median for attaching any number of devices such as transistors, diodes, semiconductors, resistors, etc. Generally, a substrate carrying an electronic device is assembled through any number of steps. Solders may be used to attach a device to a board by heat application in any number of processes known to those skilled in the art. In wave soldering, the heat is applied to the mass soldering or printed wiring assemblies on a plastic laminated board. Hundreds of connections can be soldered in a few seconds. In oven soldering, the solder is placed on the assembly and the units are placed in an oven for soldering. Vapor-phase reflow soldering may also be used for mass soldering applications.

Solders may comprise any number of constituents depending upon their application such as a flux. A solder flux generally removes surface compounds, reduces surface tension of molten solder alloy, and deters oxidation. Most inorganic fluxes are a combination of salts and acids dissolved in water with a wetting agent. Most fluxes are organic water insoluble rosins or water soluble organic acids. Rosin fluxes are preferably inert and nonconductive in the cold solid state, but active in removing tarnish when hot. Water soluble organic fluxes are used increasingly in electromechanical and electronic soldering. Most solder alloys are combinations of flux with tin and lead made in many shapes and forms such as for example wire, bar, foil, spears, ring, or paste.

After soldering, flux residues and oxides may be present in the assembly. The residual effects of processing may introduce by-products not acceptable within the resulting electronic device assemblies. Residues of soldering may comprise any number of constituents which may lead to corrosion such as lead and tin carbonates or lead and tin chloride and fluorides. These residues may generally appear as a white residue on the assembly. Solder residues may be corrosive and, if allowed to remain on the assembly, may cause malfunction.

Once assembled, the boards are placed within their environments of use. Depending upon the application, the environment of use may prove hostile to the assembly. Once in use, the assembly may be subject to attack through a number of mechanisms during its lifetime. Residues of processing, including metal chlorides, are activated by humidity and carbon dioxide to create hydrochloric acid or sulfuric acid and, under certain conditions, hydrofluoric acid and nitric acid. Vinyl acetates (by-products of the assembly processes as well) are transformed into corrosive compounds.

One means of alleviating destruction of printed wiring boards, circuit card assemblies as well as any other electronic device or assembly is the use of post processing washing processes. Removal of acidic substances, alkaline substances as well as other matters such as excess heavy metals as a means of reducing the combined effects of these residual constituents in the promotion of corrosion is a concern in the industry.

Halogenated cleaning agents are well known including chlorinated agents such as 1,1,1-trichloroethane and fluorocarbons such as freon. For example, Kraus et al, U.S. Pat. No. 3,799,803, disclose the use of a process including methanol, hydrogen peroxide and deionized water in the passivation of mercury cadmium telluride electronic devices Hayes et al, U.S. Pat. No. 4,640,719, disclose a method for reducing rosin soldering flux from printed circuit and wiring boards by using a dish washing type cleaning system and a liquid composition comprising terpene compounds.

Similarly, Futch et al, U.S. Pat. No. 4,934,391, disclose methods and compositions for removal of soldering flux, screen inks and resists using compositions containing dibasic acid esters and surfactants. Mombrun et al, U.S. Pat. No. 4,983,224, also disclose methods of removing soldering flux using nonpolar liquid compositions comprising terpenes, terpenols, mixed with polar aprotic solvents and surfactants.

Ogaya, PUJPA 63-239820 discloses a method for cleaning electronic device assemblies using a spray of pressurized carbon dioxide. Both IBM Technical Disclosure Bulletins Volume 17, No. 8, January 1975 and Volume 19, No. 10, March 1977, disclose a mechanical cleaning process using deionized water and chelating agents to remove micro particulates. However, the disclosed application of IBM will not tolerate an acid based spray or provide the necessary sensitivity to avoid erosion or destruction during processing of the submicron conductors on those devices. Smith, Corrosion Resistance of Lead, Lead Magazine, page 511–522, discusses the corrosion resistance of lead when subjected to various environmental stresses.

However, these systems, although excellent for removing rosins and activators, are not preferred in cleaning for environmental and safety reasons. Further chlorinated solvents remove rosins but also tend to remove polar activators. Combinations of alcohols and chlorinated solvents have also been used but can contribute to the presence of fluorocarbons into the environment.

SUMMARY OF THE INVENTION

The invention may be a two step process of removing solder by-products by saponifying flux constituents including rosins, and then solubilizing metal ion remnants. In accordance with a first aspect of the invention, circuit assemblies are flushed with water, and a saponifying agent to release flux constituents. The assemblies are then flushed with a metal solubilizer and a chelating agent to release and inactivate atom and compound metals. Between steps, the assemblies are generally subjected to a water rinse.

Flux constituents such as a resin or rosin are saponified by exposure to saponifying agents. Once saponified, the resulting soap is flushed from the system with water.

One example of flux is often used with various solders is rosin. A gum which is a member of the natural resin family including such resins as accroides, various shades of congo resins, damar resins, elemi gum resins, kauri resins, mastic gum resins, pontianak resins, sandarac resins, and the like. Other resins which may be useful include guar gum, agar, carrageenan, gum arabic, gum karaya, gum tragacanth, locust bean gum, starches, and celluloses as well as other water soluble resins which are often valued because of their dispersibility, rheology, coating, and protective colloid action among other characteristics. Such resins include natural cellulose and carbohydrate gums, synthetic resins such as vinyl and acrylic acids, esters, and amides, hydrophilic cellulosic and starch acrylic gums, as well as polymeric surface active agents.

Further, the process of the invention takes advantage of the reduction which occurs when metals are exposed to acidic flows. Metals such as those referenced above as present in solder including lead, tin, cadmium, bismuth and silver may easily be made anions in the presence of an acidic aqueous flow. Once anions, they are solubilized into the aqueous flow. By subsequently exposing these anions to any number of constituents capable of chelating the anions, the resulting metals are bound into a structure which makes them largely inert easily precipitated and readily recyclable.

For purposes of this disclosure, electronic devices and circuit card assemblies (CCA) may include any semiconductor device such as, for example, diodes such as basic p-n junction diodes; bipolar transistors including microwave transistors, power transistors, switching transistors, and their related structures; shockley diodes and 3-terminal thyristors, related power thyristors, unijunction transistors and trigger thyristors, as well as field control thyristors; unipolar devices which have metal semiconductor contacts such as those which function through the shottke effect, field effect transistors such as junction field effect transistors and metal semiconductor field effect transistors; diodes such as metal insulator semiconductor diodes, silicon/silicon dioxide metal oxide semiconductor diodes, and charge coupled devices; metal oxide semiconductor field effect transistors having any number of designs such as those designed for high performance capability, double diffusion capability, and the like; microwave devices including tunnel diodes, backward diodes, switch diodes and tunnel transistors; transit time diodes such as those which work through impact ionization avalanche transit time, or transferred electron devices; photonic devices such as light emitting diodes; photo detectors such as photo conductors and photo diodes, including avalanche photo diodes and photo transistors, solar cells including p-n junction solar cells, heterojunction, interface and thin film solar cells, and any number of bi-polar unipolar, microwave, or photonic devices.

Also included are devices made from any semiconductor material including silicon and its compounds, gallium and its compounds, arsenic and its compounds, mercury and its compounds, cadmium and its compounds, nitrogen and its compounds, as well as any other semiconductor material.

For purposes of this disclosure, a device substrate comprises any film, board, card, package, or assembly thereof which may be used to hold, contain, house, or otherwise act as a substrate for a semiconductor device.

DETAILED DESCRIPTION OF THE PREFERRED EMBODIMENTS

The invention is a process for removing corrosive byproducts from semiconductor assembly comprising applying a saponification agent to saponify the flux constituents and flush them from the system. An aqueous spray of metal, atom or compound, solubilizing agent may then be applied to the assembly to flush metals from the assembly and inactivating those metals.

Saponification

Generally, the invention comprises a step of saponifying the flux material used in the solder. While a solder flux may comprise any number of constituents, these constituents may prove to be highly alkaline or highly acidic and thus corrosive. Further, certain resins such as rosin are not readily water soluble without chemical modification. Accordingly, the function of the first step of the invention is to transform the flux into a water soluble constituent for release or removal from the system. While this may be done through any number of means, one preferred means comprises the saponification of the resin through application of a highly alkaline aqueous spray.

Generally, any number of constituents may be used in accord with the process of the invention to saponify the resin flux used in the solder. Preferably, the saponification agent will be one which is aqueous soluble or otherwise soluble in an acceptable organic solvent and which in the proper environment will lead to the saponification of the resin flux.

Acceptable saponification agents include any alkaline or basic element, compound, polymer, or other composition which may function in the role of accepting protons and donating electrons. Useful saponification agents include hydroxides such as lithium hydroxide, sodium hydroxide, potassium hydroxide, magnesium hydroxide, beryllium hydroxide, calcium hydroxide, and strontium hydroxide.

Organic compounds may also be used as saponification agents including ammonium hydroxide as well as alkaline amines such as monomethyl amine, dimethyl amine, trimethyl amine, monoethyl amine, diethyl amine, triethyl amine, dipropyl amine, isopropyl amine, and butyl amine, dibutyl amine, diisobutyl amine, cyclohexyl amine, dicyclohexyl amine, and the like.

Also useful are fatty amines such as primary, secondary, and tertiary alkyl amines. Also useful are cyclic amines such as morpholene, and the like; aromatic amines such as aniline and its derivatives; diaminotoluene and its derivatives, diaryl amine compounds, methylene dianiline, and phenyl diamines, are also useful in the process of the invention.

In use, the process of the invention generally comprises a saponifying spray which may comprise water and the saponifying constituent. The concentration of the saponifying constituent may generally range from 1 wt-% to 10 wt-%, preferably from 3 wt-% to 7 wt-%, and most preferably the saponifying constituent comprises ammonium hydroxide in a compositional concentration of about 5 wt-%.

Depending upon the area of the assembly which is to be exposed to the saponifying spray, the flow rate may range from generally about 20 gpm to 100 gpm, preferably from about 30 gpm to 90 gpm, and most preferably from about 50 gpm to 70 gpm.

For adequate saponification to take place, an alkaline pH is generally appropriate. The most desirable pH of the saponifying spray will range from about 7 to 14, preferably from about 8 to 13, and most preferably from about 9 to 12.

Again, given the area of the assembly to be treated, as well as the nature of the circuit assembly and the saponifying constituent, the spray time may range generally from about 5 minutes to 30 minutes, preferably from about 10 minutes to 20 minutes, and most preferably from about 12 to 17 minutes.

Further, the temperature of the spray may range from about 40° C. to 70° C., preferably from about 45° C. to 60° C., and most preferably about 53° C. The spray may be applied through means known to those of skill in the art such as those useful in pressurized washing hard substrates of ceramic and metal alloy as examples, at a pressure ranging from about 10 psi to 70 psi, preferably 20 psi to 60 psi, and most preferably about 30 psi nozzle speed.

Once the saponification step is completed, the assembly may be rinsed to fully remove any residues from saponification. The rinsing step may proceed for a time ranging from about 1 minute to 15 minutes, and preferably about 7 minutes to 8 minutes. The rinsing step generally also may be completed with any number of rinses including water, as well as lower alkyl alcohols such as methanol ethanol, propanol, or mixtures thereof.

Preferably, the rinse is nontoxic such as an aqueous rinse which carries a resistance of about 0.5 Mohm to 1.5 Mohm, preferably about 0.75 Mohm to 1.25 Mohm, and most preferably about 0.75 Mohm to 1 Mohm to provide adequate cleaning of the substrates as well as avoiding hyperactivity of the water against any of the areas being cleaned. The rinse may be applied at pressures ranging from about 10 psi to about 70 psi; and preferably about 20 psi to 40 psi to provide the necessary pressure to dislodge all residue from the system.

Demetallization and Chelation

The process of the invention also comprises a demetallization step. In this step, deleterious metals and metal compounds are removed through a series of washings. The purpose of demetallization is to reduce the presence of acidic or alkaline metals which, when exposed to various environmental characteristics through an environment of use, will result in the destruction of the device or the device substrate. Once the device or device assembly has been exposed to a saponifying agent and flush, the device or device assembly is then exposed to an aqueous acidic flow. The aqueous acidic flow is intended to ionize unneeded metals on the surface of the device or assembly and by doing so, solubilize these metals into the aqueous flow.

Generally, any number of constituents may be used to create an acidic pH within the aqueous flow. Preferably, the pH of the aqueous flow will range from about 2 to 7, preferably from about 3 to 6, and most preferably from about 3 to 5 to effectively ionize by-product metals.

Generally, any element, compound, or polymer which will effectively contribute protons to the aqueous solution thereby lowering its pH may be used in accordance with the invention. Monoprotic and polyprotic mineral acids of arsenic, boron, nitrogen including cyanic acid, hydrozoic acid, acids of fluorine, sulfur, including hydrogen sulfate and hydrogen sulfide, acids of chlorine, phosphorus, and the like are useful in this aspect of the invention. Also useful are certain organic acids such as short chain and long chain fatty acids, including acetic acid, octanoic acid, formic acid, hydrogen peroxide, oxalic acid, and the like. One preferred acidic wash comprises carbon dioxide used in an aqueous spray which induces a carbonation of the various metal constituents on the device or CCA device assembly. Further, a carbon dioxide source may be used with any other acid source such as those previously mentioned. These other acids, when used, assist in accelerating the cleaning process.

Preferably, the acid sources used in this step comprise carbon dioxide as well as those naturally occurring by products of the process at a pH of about 3 to 5. Preferably, the aqueous spray is prepared by exposing a jet of water to an atmosphere of about 150 psi to 175 psi carbon dioxide to produce sufficient concentrations of $CO_2$ diluted within the water by processes known in the art.

Generally, the acid may be present in the wash in a concentration necessary to provide the required pH as detailed above. Acid concentrations may range generally from about 0.1 wt-% to 1 wt-%, preferably from about 0.2 wt-% to 0.5 wt-%, and most preferably from about 0.35 wt-% to 0.1 wt-% using a 0.1 N molar acid composition.

The time and volume of acidic spray will depend upon the size of the device or assembly to be processed. Generally, the preferred carbonated acidic spray may be applied for a period ranging from about 1 minute to 5 minutes, preferably from about 1.5 minutes to 4.5 minutes, and most preferably from about 2 minutes to 4 minutes.

The pressure of the spray again will depend upon the nature of the assembly and the amount of by-product to be cleaned therefrom. Preferred pressures include those from about 10 psi to 40 psi, more preferred from about 20 psi to 30 psi, and most preferred about 25 psi and a flow rate of about 4 gpm to 12 gpm, preferably about 5 gpm to 10 gpm, and most preferably about 6 gpm to 8 gpm to provide the maximum cleaning ability without damage to the semiconductor structure.

During or after application of the acidic spray to the device or device assembly, it may be neutralized with the appropriate neutralization element. Any number of agents may be used to inactivate the acidic metal liquid such as chelating agents, ligands, or any other element, compound, or polymer which will effectively precipitate or otherwise neutralize the active metal within the acidic solution.

Agents found preferable in neutralizing and inactivating metals include chelating agents or ligands which contain donor atoms that can combine by coordinate bonding with a single metal ion to form a cyclic structure called a chelating complex. Chelating agents provide a means of manipulating and controlling metal ions by forming complexes that have properties that are markedly different from the original metal ions. Any chelating agent or ligand may be used which will provide for coordinate bonds between a metal ion and two or more atoms in the molecule of the chelating agent or ligand.

Chelating agents are generally regarded as electron donors while the metal ion is an electronic receptor. The capacity of the chelating agent will depend on the number of chelating rings in the complex. Each ring is regarded as a dentate structure with a chelating agent having two rings being bidentate, for example, and rings which have only one donor atom such as dimethylamine being considered monodentate. Generally, chelating agents comprise organic or inorganic compounds having atoms such as nitrogen, oxygen, sulfur, phosphorus, arsenic, and selenium, all of which readily form chelates.

Chelating agents of use in the invention include amino carboxylic acids such as ethylene diamine tetraacetic acid including any mono-, di-, tri, or tetra alkali or alkaline earth salts of this acid as well as other polydentate ligands such other equivalent ligands are amino carboxylic acid such as 1,2-diaminocyclohexane-tetraacetic acid, diethylenetriaminopentaacetic acid, 8-hydroxyquinoline or substituted 8-hydroxyquinolines such as 8-hydroxyquinoline-5-sulfonic acid, as well as free polycarboxylic acid chelating agent such as alkylene-polyimine polyacetic acid, ethylene diamine tetraacetic acid, N-hydroxyethylethylene diamine triacetic acid, nitrilo triacetic acid, N-2-hydroxyethyliminodiacetic acid, diethylene triaminepentaacetic acid, and mixtures thereof.

Other chelating agents which may be incorporated into the process of the invention include water soluble acrylic polymers such as polyacrylic acid, polymethacrylic acid, acrylic acid-methacrylic acid copolymers, hydrolyzed polyacrylomide, hydrolyzed methacrylamde, hydrolyzed acrylamide methacrylomide copolymers, hydrolyzed polyacrylonitrile, hydrolyzed polymethacrylonitrile, hydrolyzed acrylonitrile methacrylonitrile copolymers, or mixtures thereof. Water soluble salts or partial salts of these polymers such as the respective alkali metal (e.g., sodium, potassium) or ammonium salts can also be used in the process of the invention.

Ligands also useful as chelating agents include mono, di, tri and tetraphosphonic acids and phosphonopolycarboxylic acids such as 1-phosphono-1-methylsuccinic acid, phosphonosuccinic acid and 2-phosphonobutane-1,2,4-tricarboxylic acid, among others.

The concentration of chelating agent generally found useful in accordance with the invention ranges from about 0.1 wt-% to 1 wt-%, preferably from about 0.2 wt-% to 0.5 wt-%, and most preferably ethylene diamine tetraacetate present in a concentration ranging from about 0.2 wt-% to 0.3 wt-% when introduced into the acidic flow. The concentration may vary depending upon the amount of residue released from the device or device assembly.

Once the acidic flow has been treated to neutralize all metal ions, and the metal ions have been removed, the acidic flow may be recycled for further processing.

Working examples are now provided to illustrate various embodiments of the invention. However, these examples should not be construed as limiting of the invention.

WORKING EXAMPLES

Six sample printed wiring boards were processed by first cutting the printed wiring boards into coupons. The samples were then cleaned with denaturalized alcohol to remove handling residues such as oils. Soldering flux mildly activated rosin was then applied to the samples. The soldering flux was then activated by appropriate preheat.

The samples were then exposed to a float/drag soldering process to prompt the creation of white solder residues. Our intent was to create the conditions able to challenge the cleaning method of the invention by producing severe pre-cleaning contaminants. After soldering, the samples cooled down to ambient temperature.

The samples were then heated to 55° C. (+/−5° C.). Utilizing 5 wt-% ammonium hydroxide (3% w/v±0.5%) the soldering flux residues were saponified.

The samples were then rinsed with DI water (1.0 Mohm) to completely remove the soap created. The samples were then processed with carbonated water (approximately 1% $CO_2$). The resulting wash was cycled with a chelating agent for one minute to chelate all free metals.

The samples were then rinsed with DI water and let to dry for 12 hours at ambient temperature and humidity. The samples were then tested on the division Omega 300 Ionic contamination tester. All samples had an ionic contamination level ranging from 0 microgram of NaCl per square inch of CCA to 7 micrograms of NaCl per square inch of CCA.

The above specification, examples and data provide a complete description of the manufacture and use of the composition of the invention. Since many embodiments of the invention can be made without departing from the spirit and scope of the invention, the invention resides in the claims hereinafter appended.

We claim as our invention:

1. A process for removing corrosive by-products from a circuit assembly, said process comprising the steps of:
   (a) applying an aqueous flush to the assembly, said aqueous flush comprising an effective saponifying amount of an alkaline agent;
   (b) applying an acidic aqueous wash to the assembly; and
   (c) treating the acid aqueous wash with an effective amount of a chelating agent.

2. The process of claim 1 wherein said aqueous alkaline flush is applied for a time period ranging from about 5 minutes to 30 minutes.

3. The process of claim 1 wherein said aqueous alkaline flush is applied at a temperature ranging from about 40° C. to 70° C.

4. The process of claim 1 wherein said alkaline agent is selected from the group consisting of an amine source, an inorganic hydroxide, an amine hydroxide, or mixtures thereof.

5. The process of claim 1 wherein said aqueous alkaline flush is applied through agitation.

6. The process of claim 5 wherein said aqueous alkaline flush is applied at pressure ranging from about 20 psi to 100 psi.

7. The process of claim 1 wherein said alkaline agent source comprises ammonium in a concentration ranging from about 1 wt-% to 10 wt-%.

8. The process of claim 1 wherein said acidic aqueous wash comprises carbon dioxide present at a pH ranging from about 3 to 5.

9. The process of claim 1 wherein said aqueous acid wash is applied for a period ranging from about 1 minute to 5 minutes.

10. The process of claim 1 wherein said aqueous acidic wash is applied at a pressure ranging from about 10 psi to 40 psi.

11. The process of claim 1 comprising the additional step of rinsing the assembly with water after saponification.

12. A process for removing corrosion producing by-products, from a circuit assembly said process comprising the steps of:

(a) applying an aqueous spray, said aqueous spray comprising an effective saponifying amount of an ammonium hydroxide source;
(b) rinsing with water;
(c) applying an aqueous spray comprising an effective acidifying amount of carbon dioxide; and
(d) treating said acidified aqueous spray wash with an effective amount of ethylene diamine tetraacetate.

13. The process of claim 12 wherein said saponifying aqueous ammonium hydroxide spray is applied through agitation.

14. The process of claim 12 wherein said saponifying ammonium hydroxide spray is applied at pressure ranging from about 10 psi to 70 psi.

15. The process of claim 12 wherein said aqueous spray comprising an alkaline agent comprises ammonium in a concentration ranging from about 1 wt-% to 10 wt-%.

16. The process of claim 12 wherein said aqueous spray comprises carbon dioxide present at a pH ranging from about 3 to 5.

17. The method of claim 12 wherein said ethylene diamine tetraacetate is present in the acidic spray in a concentration ranging from about 0.1 wt-% to 1 wt-%.

18. A process for removing corrosion producing by-products from a circuit assembly, said process comprising the steps of:
(a) applying an alkaline aqueous spray, said aqueous spray comprising ammonium hydroxide present in a concentration ranging from about 1 wt-% to 10 wt-%;
(b) applying an aqueous spray comprising a carbon dioxide present at a pH concentration ranging from about 1 to 7; and
(c) treating said carbon dioxide containing aqueous spray with a chelating agent.

* * * * *